United States Patent
Staszewski et al.

(10) Patent No.: US 7,929,637 B2
(45) Date of Patent: Apr. 19, 2011

(54) METHOD AND APPARATUS FOR DIGITAL AMPLITUDE AND PHASE MODULATION

(75) Inventors: Robert B. Staszewski, Garland, TX (US); Sameh Rezeq, Dallas, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1083 days.

(21) Appl. No.: 10/927,879

(22) Filed: Aug. 27, 2004

(65) Prior Publication Data

US 2005/0271161 A1 Dec. 8, 2005

Related U.S. Application Data

(60) Provisional application No. 60/577,508, filed on Jun. 4, 2004.

(51) Int. Cl.
*H04L 27/00* (2006.01)

(52) U.S. Cl. ........ 375/295; 375/296; 375/298; 375/300; 375/297; 375/302

(58) Field of Classification Search ............... 375/296, 375/345, 297, 295, 298, 300, 302; 332/151, 332/108, 115; 331/100, 16, 179; 341/143, 341/131, 50, 160
See application file for complete search history.

(56) References Cited

U.S. PATENT DOCUMENTS

| | | | |
|---|---|---|---|
| 6,542,104 B1* | 4/2003 | Capofreddi ................... 341/160 |
| 6,653,909 B2* | 11/2003 | Nielsen ......................... 332/151 |
| 6,658,748 B1* | 12/2003 | Leipold et al. ................ 331/179 |
| 6,909,757 B2* | 6/2005 | Justice et al. ................. 375/297 |
| 6,983,025 B2* | 1/2006 | Schell .......................... 375/296 |
| 7,012,477 B2* | 3/2006 | Harron et al. ................ 332/108 |
| 7,271,757 B2* | 9/2007 | Nakamoto et al. ........... 341/160 |
| 7,313,199 B2* | 12/2007 | Gupta et al. .................. 375/297 |
| 7,352,297 B1* | 4/2008 | Rylyakov et al. .............. 341/50 |
| 2002/0057214 A1* | 5/2002 | Brooks ......................... 341/131 |
| 2002/0158696 A1* | 10/2002 | Staszewski et al. .......... 331/100 |
| 2002/0180547 A1* | 12/2002 | Staszewski et al. .......... 332/115 |
| 2003/0133522 A1* | 7/2003 | Staszewski et al. .......... 375/345 |
| 2003/0141936 A1* | 7/2003 | Staszewski et al. ............ 331/16 |
| 2004/0066240 A1* | 4/2004 | Staszewski et al. ......... 331/36 C |
| 2004/0263246 A1* | 12/2004 | Robinson et al. ......... 330/124 R |
| 2005/0030212 A1* | 2/2005 | Brooks ......................... 341/143 |

OTHER PUBLICATIONS http://en.wikipedia.org/wiki/Thermometer_code; p. 1.*
http://en.wikipedia.org/wiki/Thermometer_code; p. 1. (date unknown).*

* cited by examiner

*Primary Examiner* — Shuwang Liu
*Assistant Examiner* — Kabir A Timory
(74) *Attorney, Agent, or Firm* — Ronald O. Neerings; Wade James Brady, III; Frederick J. Telecky, Jr.

(57) ABSTRACT

A transmitter using quadrature modulation includes a rectangular to polar converter for converting data symbols into a polar form, where each polar symbol has a magnitude signal and an angle signal. Digital phase modulation circuitry includes an all digital PLL circuit for generating a phase modulated RF carrier signal responsive to the angle signal frequency control word (FCW) and a carrier frequency FCW. A digitally controlled amplifier for amplifying the phase modulated signal is controlled by a digital amplitude control circuitry for controlling the gain of the digitally controlled amplifier responsive to the magnitude signal.

25 Claims, 7 Drawing Sheets

US 7,929,637 B2

METHOD AND APPARATUS FOR DIGITAL AMPLITUDE AND PHASE MODULATION

CROSS-REFERENCE TO RELATED APPLICATIONS

This application claims the benefit of the filing date of copending provisional application U.S. Ser. No. 60/577,508, filed Jun. 4, 2004, entitled "DIGITAL METHOD OF AMPLITUDE MODULATION FOR EDGE".

STATEMENT OF FEDERALLY SPONSORED RESEARCH OR DEVELOPMENT

Not Applicable

BACKGROUND OF THE INVENTION

1. Technical Field

This invention relates in general to communication devices and, more particularly, to a fully digital method and apparatus for amplitude and phase modulation.

2. Description of the Related Art

Quadrature modulation is commonly used for communication. FIG. 1 shows a conventional prior art direct up-conversion transmitter 10. The in-phase (I) and quadrature (Q) pulse-shaped digital baseband signals from the digital baseband 12 are converted into analog domain with digital-to-analog (D/A) converters 14. Due to their digital nature, the D/A outputs exhibit strong sampling-time harmonics and switching noise, which have to be conditioned with low-pass filters (LPF) 16 before being up-converted to the RF carrier by a modulator 18, which is a critical RF/analog block. The RF frequency synthesizer 20 is used as a local oscillator (LO) in the transmitter 10 to perform frequency translation. The power amplifier (PA) 22 is the last stage of the transmitter path. The power amplifier performs antenna impedance matching and brings the emitted signal to the required power level for transmission to the antenna 24.

A major weakness of this mixer-based transmitter architecture is that even a small mismatch in phase shift or amplitude gain between the I and Q paths can significantly impair the system performance. Furthermore, because of a certain amount of inherent frequency shift between the modulator input and output (it performs frequency translation by design), the strong power amplifier signal can cause frequency pulling of the oscillator 20 through injection locking. This mechanism finds parasitic paths, such as substrate, power and ground lines as well as electromagnetic radiation to feed strong power amplifier signal into most sensitive parts of the oscillator.

Accordingly, the analog sections of the transmitter 10 require significant component matching for accurate performance and is not amenable to a deep-submicron CMOS implementation.

Therefore, a need has arisen for an quadrature modulation circuit which can be efficiently implemented with CMOS fabrication techniques.

BRIEF SUMMARY OF THE INVENTION

In the present invention, a transmitter using quadrature modulation comprises circuitry for converting data symbols into a polar form, having a magnitude signal and an angle signal, digital phase modulation circuitry for generating a phase modulated signal responsive to the angle signal, a digitally controlled amplifier for amplifying the phase modulated signal, and digital gain control circuitry for controlling the gain of the digitally controlled amplifier responsive to the magnitude signal.

The present invention provides significant advantages over the prior art. First, a solution having an all digital amplitude modulation path and an all digital phase modulation path increases the performance of the transmitter. Second, an all digital amplitude modulation transmitter can be fabricated using deep submicron CMOS technology, thereby reducing the cost of the transmitter.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention is best understood in relation to FIGS. 1-16 of the drawings, like numerals being used for like elements of the various drawings.

Figure 2:
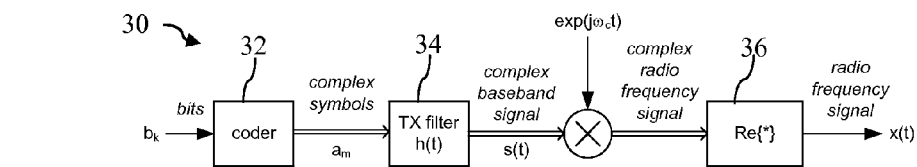
FIG. 2 illustrates a general block diagram of a transmit quadrature amplitude modulation (QAM) circuit using complex signals.

FIG. 2 illustrates a general block diagram of a transmit quadrature amplitude modulation (QAM) circuit 30 using complex signals. It mathematically describes an arbitrary modulation process. The incoming bit stream $b_k$ is fed to a coder 32, which converts the "0" or "1" digital bits into a stream of symbols $a_m$. A symbol assumes values from an alphabet. Since the coder may map multiple bits into a single data symbol, a distinction must be made between the symbol rate and the bit rate. In Bluetooth and GSM there is a one-to-one correspondence between the bits and symbols: {0,1}→{−1,+1}. More advanced encoding schemes, such as QPSK or 8PSK, for example, pack two or three bits into a symbol, respectively.

Symbols are applied to a transmit filter 34, which normally produces a continuous-time signal for transmission over the continuous-time channel. The main purpose of employing the baseband transmit filter 34 is to properly and efficiently constrain the bandwidth occupied by the modulated RF spectrum. When rectangular pulses are passed through a bandlimited channel, the pulses will spread in time, and the pulse for each symbol will smear into the time intervals of succeeding symbols. This causes intersymbol interference (ISI) and leads to increased probability of the receiver making an error in detecting a symbol. Out-of-band radiation in the adjacent channel in a mobile system should generally be 40 dB to 80 dB below that in the desired passband. Since it is difficult to directly manipulate the transmitter spectrum at RF frequencies, spectral shaping is done in baseband.

The impulse response h(t) of the transmit filter 22 is called the pulse shape and it could be raised-cosine or Gaussian. The raised-cosine rolloff filter belongs to the class of filters which satisfy the Nyquist criterion of no ISI at the sampling instances. Gaussian filters, on the other hand, have a smooth transfer function but do not satisfy the Nyquist criterion and allow for a certain amount of ISI at zero-crossings. However, they can employ power-efficient non-linear amplifiers and are commonly used with frequency modulated signals.

In modern implementations, the pulse shape is oversampled by a sampling clock, which usually is an integer multiple of the symbol clock. It is represented digitally throughout the pulse filtering process, even though the filter output s(t) is usually, in the end, brought back to the continuous-time domain by performing a digital-to-analog conversion and subsequent, low-pass filtering.

The digital baseband data bits $b_k$ are synchronous to the baseband clock, whereas the digital filter output samples are synchronous to the sampling clock, which is conventionally a multiple of the data rate. In block 36, the real portion of the complex signal is passed to the antenna.

Figure 3:
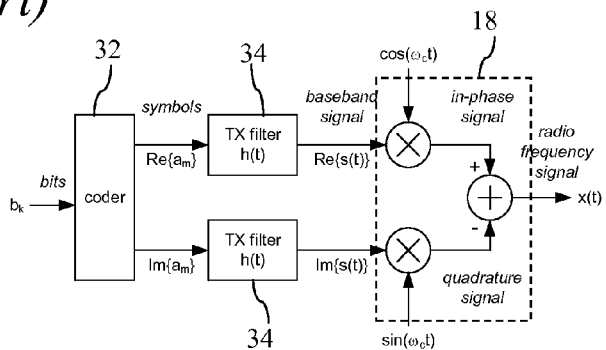
FIG. 3 shows a block diagram of a conventional QAM transmit modulation using in-phase (I) and quadrature (Q) signals.

Complex signal representation requires two physical wires that carry both real-valued parts of a complex number. FIG. 3 shows a block diagram of a QAM transmit modulation using in-phase (I) and quadrature (Q) signals that represents a natural progression towards a more physically-realizable representation. This realization is the basis for the conventional transmit modulator 10 described above and can handle a wide range of modulation schemes. However, its I/Q imbalance and carrier feedthrough usually leads to poor sideband suppression.

Figure 4:
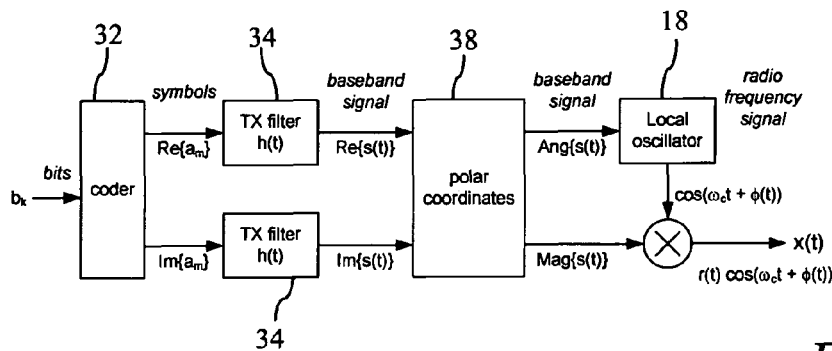
FIG. 4 shows a block diagram of a conventional QAM transmit modulation using a polar alternative in a form of direct amplitude and phase modulation.

FIG. 4 shows a block diagram of a QAM transmit modulation using a polar alternative in a form of direct amplitude and phase modulation. A rectangular-to-polar converter 38 converts a rectangular representation of the baseband signal to a polar form. The direct phase modulation is conventionally performed by modulating the oscillator frequency tuning input in a feed-forward manner with a possible PLL loop compensation method. The direct amplitude modulation might be performed by a conventional method of regulating the supply voltage to a saturation-mode power amplifier, or it could be made fully digital. The QAM polar method is clearly the best choice for digital integration of mobile RF transceivers because it does not use the traditional RF/analog-intensive up-conversion mixer of FIG. 1.

Figure 5:
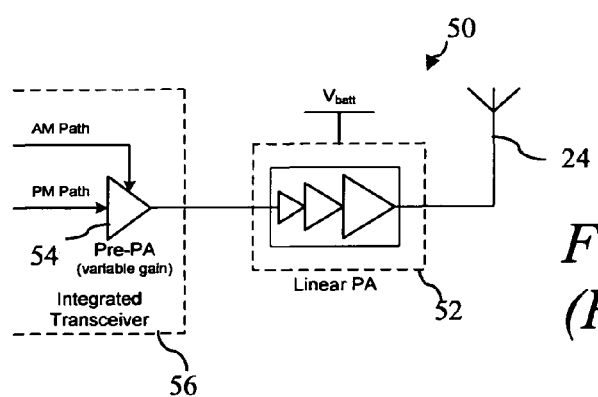
FIG. 5 shows a conventional transmitter with a linear external power amplifier.

There are currently two basic methods of performing amplitude modulation in a transmitter system with an external power amplifier. FIG. 5 shows a transmitter 50 with a linear external power amplifier 52. The amplitude modulation of a constant-envelope RF signal is performed by a pre-power amplifier (PPA) 54, which is part of an integrated transceiver 56. The amplitude control could be analog or digital. This circuit, however, is not particularly energy efficient.

Figure 6:
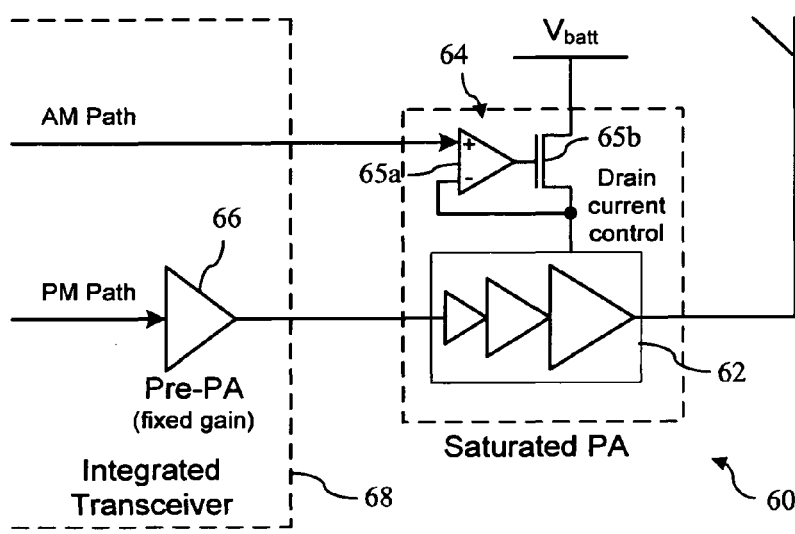
FIG. 6 shows a conventional transmitter that utilizes an external power amplifier operating in the saturated mode.

FIG. 6 shows a transmitter 60 that utilizes an external power amplifier 62 operating in the saturated mode. The amplitude modulation is accomplished by regulating drain current of last stages of the power amplifier using control circuit 64 including op-amp 65a driving n-channel transistor 65b. The pre-power amplifier 66 in the integrated transceiver 68 of this circuit behaves more like as a buffer with at most a static control of the output power.

Figure 1:
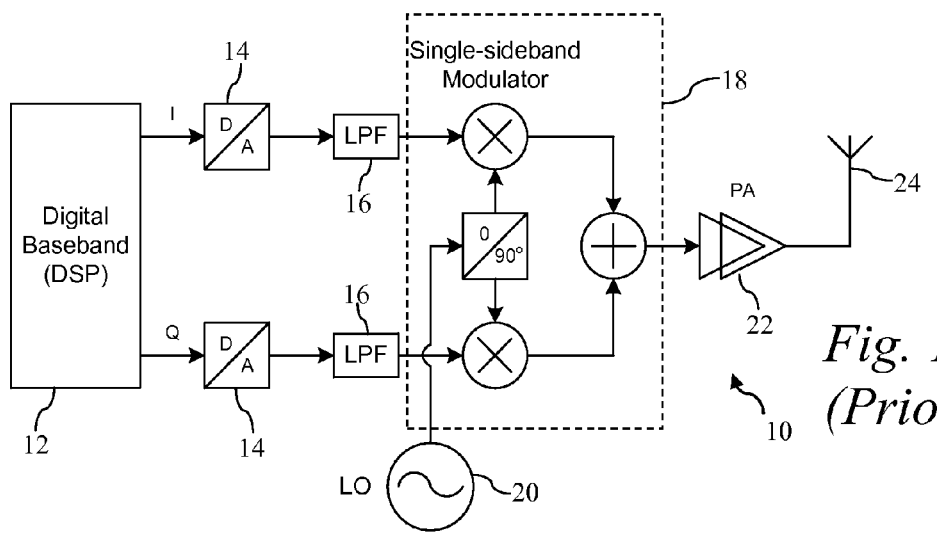
FIG. 1 shows a conventional prior art direct up-conversion transmitter.
Figure 7:
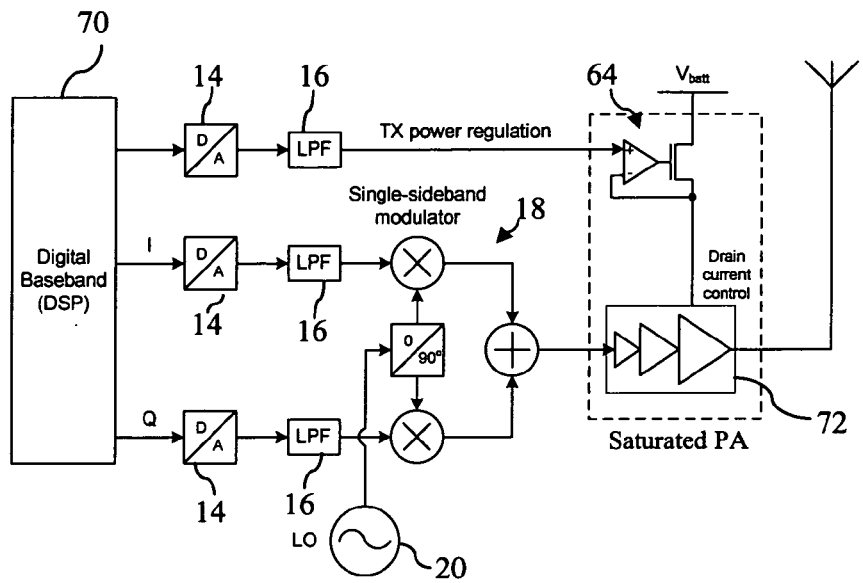
FIG. 7 shows a conventional I/Q upconversion transmitter with an external power amplifier operating in a saturation mode in which the static output power is controlled by regulating the drain current.

FIG. 7 shows a conventional I/Q upconversion transmitter 70, similar to FIG. 1, with an external power amplifier 72 operating in a saturation mode in which the static output power is controlled by regulating the drain current. Operating point of the PA's last stage is appropriately set mainly to increase the power-added efficiency (PAE).

Figure 8:
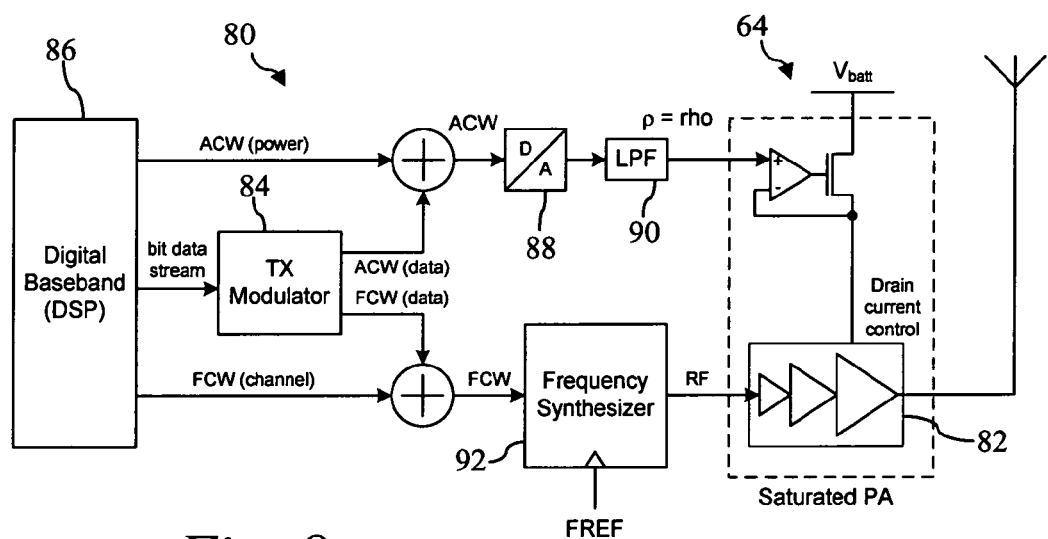
FIG. 8 shows a prior art QAM transmitter with a saturation-mode power amplifier with a digital phase modulation path.

FIG. 8 shows a QAM transmitter 80 with a saturation-mode power amplifier 82. A transmit modulator 84 receives the data bits from the digital baseband 86 and generates digital values for the amplitude (ACW—amplitude control word) and phase (FCW—frequency control word) modulation. The drain current regulation is done dynamically to perform both the static power control (ACW(power)) and the amplitude modulation (ACW(data)). The ACW is converted to an analog value by D/A converter 88 and filtered by low pass filter 90. This scheme, however, does not use the analog-intensive I/Q upconverting mixer 18, as shown in FIG. 7. Instead, the phase modulation is performed by a digitally controlled frequency synthesizer 92 with wideband frequency modulation capability. The frequency synthesizer 92 produces a frequency at a multiple of a local reference frequency, FREF, responsive to the FCW. A frequency synthesizer of this type is described in connection with FIGS. 15 and 16.

Figure 9:
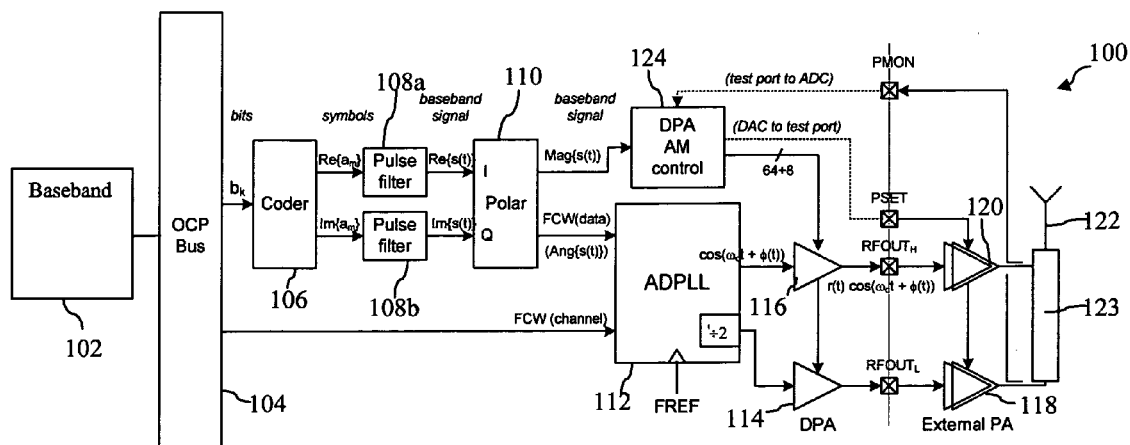
FIG. 9 illustrates a block diagram of a transmitter with fully digital phase modulation and amplitude modulaton paths.

FIG. 9 illustrates a block diagram of a transmitter 100 with fully digital PM and AM paths, unlike the transmitter of FIG. 8 which has only a fully digital PM path. Data bits from the baseband 102 are received over an OCP (Open Core Protocol) or other bus 104. The bits, $b_k$, are received by coder 106. The coder 106 translates the data bits to real and imaginary symbols. The real symbols Re{$a_m$} are input to pulse filter 108a and the imaginary symbols Im{$a_m$} are input to pulse filter 108b. The output of pulse filter 108a, Re{s(t)}, and the output of pulse filter 108b, Im{s(t)}, are input to a rectangular to polar converter 110 (which can be realized using a cordic algorithm), which outputs Mag{s(t)}, the amplitude modulation signal, and Ang{s(t)}, the phase modulation signal. Ang{s(t)}, or FCW(data) after differentiation (the frequency is the time derivative of phase), is added to FCW(channel) in ADPLL (All digital phase lock loop) 112. ADPLL 112 is described in greater detail in connection with FIGS. 15 and 16. ADPLL 112 outputs a high band signal to DPA (digitally controlled power amplifier) 116 and a low band (÷2) signal to DPA 114. The output of DPA 114 is coupled to external power amplifier 118 through package pin RFOUT$_L$ and the output of DPA 116 is coupled to external power amplifier 120 through package pin RFOUT$_H$. Power amplifiers 118 and 120 operate in linear mode. Power amplifiers 118 and 120 are coupled to antenna 122 through a high-band/low-band switch 123.

Figure 12:
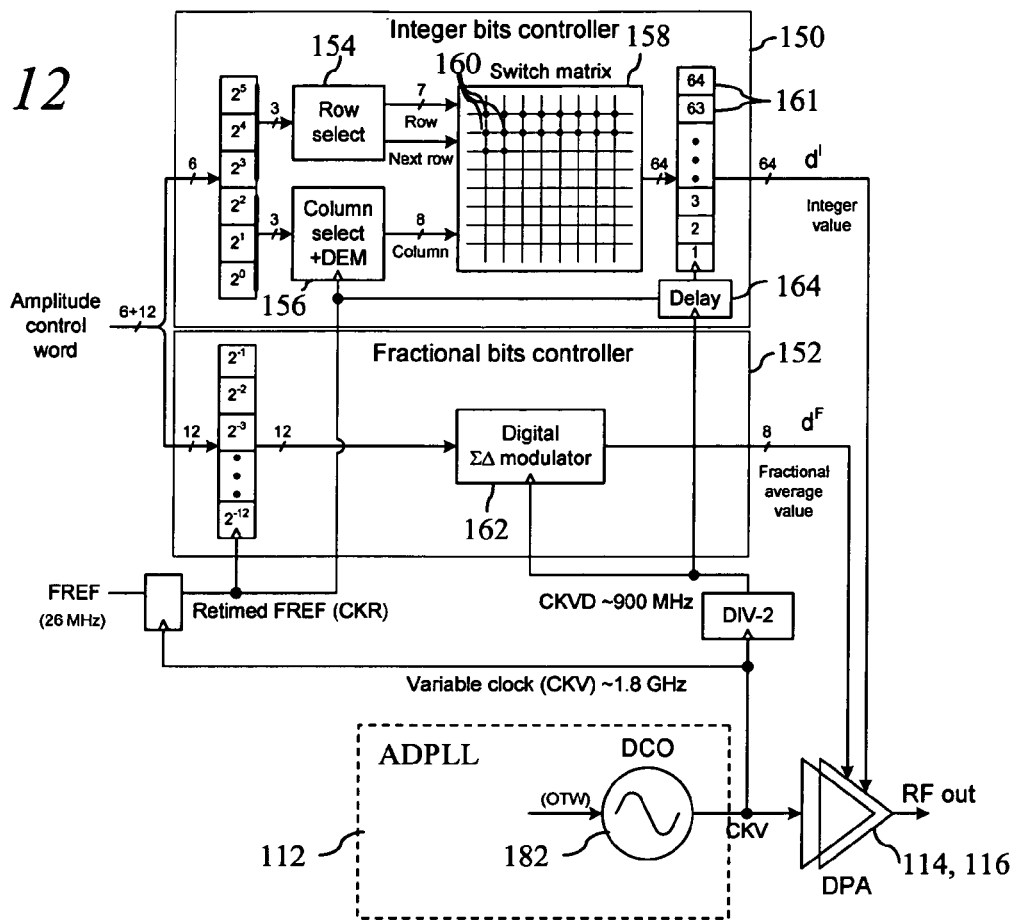
FIG. 12 illustrates a block diagram of a preferred embodiment for the AM control circuit of FIG. 9.

In the AM path, Mag{s(t)} is coupled to AM control circuit 124, shown in greater detail in connection with FIG. 12. The output of AM control circuit 124 is coupled to DPA 114 and 116. In the illustrated embodiment, the AM control circuit provides a 64-bit integer and 8-bit fractional "pseudo-thermometer code" output. The fractional bits are ΣΔ modulated. In pseudo-thermometer code, each bit has a unitary value regardless of place, i.e., each bit is unit weighted. Thus, a binary "000011" would be translated to "000 . . . 000111" and binary "000111" would be translated to "000 . . . 0001111111". As described below, it is not necessary for the "1"s and a "0"s to be all grouped together; hence the thermometer value "11000111" has the same value as "00011111".

Figure 10:
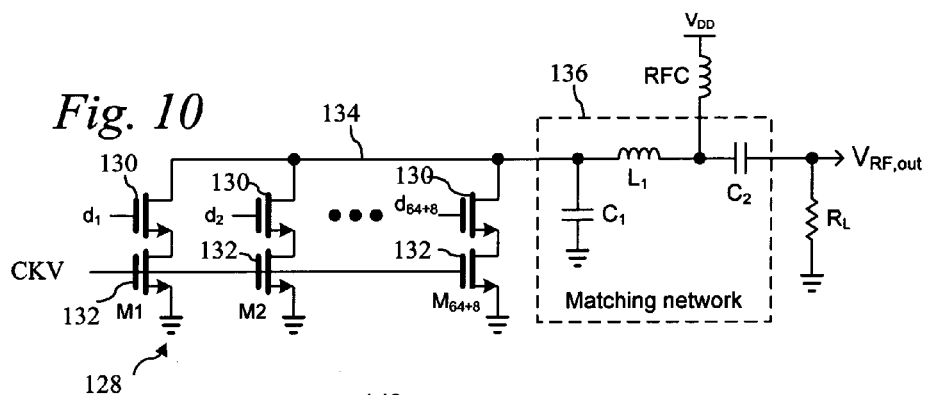
FIG. 10 illustrates a first embodiment of a digitally controlled amplifier, which could be used in FIG. 9.

FIG. 10 illustrates a first embodiment of a DPA 128, which could be used for DPA 114 or 116. The 64+8 bits output from AM control circuit 124 are coupled to the gates of respective n-channel CMOS transistors 130. Each transistor 130 has source/drains coupled in series with a respective n-channel transistor 132 between voltage rail 134 and ground. N-channel transistors 132 have gates coupled to the output of the ADPLL 112. Voltage rail 134 is coupled to matching network 136, for converting the switch state (its resistance or drain current) to a sinusoid. Resistor $R_L$ represents the input impedance of the external power amplifier.

In operation, the main attribute of the DPA 128 of FIG. 10 is low noise. The thermometer code output of AM control 124 determines how many transistors 130 are enabled. The RF amplitude is digitally controlled by regulating the number of active switches in accordance with the desired instantaneous amplitude.

Figure 11:
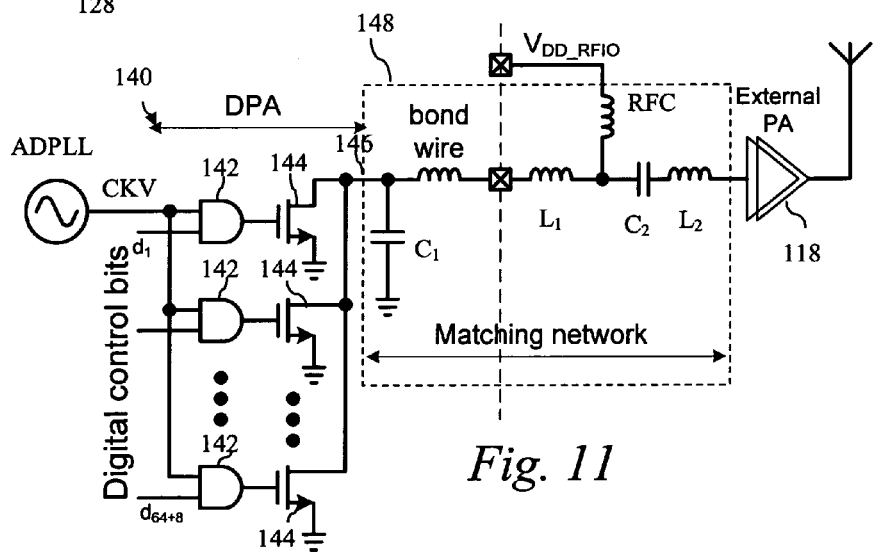
FIG. 11 illustrates a second embodiment of a digitally controlled amplifier, which could be used in FIG. 9.

FIG. 11 illustrates a second embodiment of a DPA 140, where the 64+8 bits output from the AM control circuit 124 drive one input of respective AND gates 142. The other input of each AND gate 142 is driven by the output of the ADPLL 112. Each AND gate 142 drives the gate of an n-channel transistor 144, where each n-channel transistor has source/drains coupled between a matching network input, voltage rail 146 and ground. A matching network 148 is coupled between the voltage rail, transistor switches output 146 and the external power amplifier.

In operation, the DPA 140 improves on the carrier leakage of DPA 128 of FIG. 10. The AND gates 142 may be implemented as a complementary pass gate with a pull-down n-channel transistor. Similar to FIG. 10, the output of AM control circuit 124 determines the number of transistors 144 that are dynamically enabled.

FIG. 12 illustrates a block diagram of a preferred embodiment for the AM control circuit 124. The AM control circuit receives the clock, CKV, from the DCO 182 of ADPLL 112 (see FIG. 16) and a re-timed clock reference, CKR, which is the clock of the reference signal, FREF, retimed to CKV. As state above, the CKV is a multiple (possibly real-valued) of FREF, based on FCW. The main purpose of the AM control circuit 124 is to translate an amplitude control word (ACW) from a 6-bit integer, 12-bit fractional binary representation to a 64-bit thermometer code representation with an additional 8-bit ΣΔ modulated fractional portion. This portion of the circuit is described in connection with U.S. Ser. No. 10/006,607 (Pub. No. 2002/0158696), entitled "Frequency Synthesizer With Digitally-Controlled Oscillator", to Staszewski et al, filed Nov. 30, 2001, which is incorporated by reference herein.

In the illustrated embodiment, ACW has six integer bits and twelve fractional bits. The integer bits are processed by the integer controller 150 and the fractional bits are processed by the fractional controller 152. The integer tracking oscillator controller 150 includes a row select circuit 154 and a column select and DEM (dynamic element matching) circuit 156. The outputs of the row select circuit 154 and a column select and DEM circuit 156 are received by a switch matrix 158. The switch matrix 158 provides sixty-four discrete switches 160 (corresponding to the sixty-four inputs to the DPA) that may be enabled or disabled by the row select circuit 154 and column select and DEM circuit 156 responsive to ACW. The switch matrix 158 is coupled to a bank of sixty-four resampling drivers 161. The resampling drivers 161 selectively enable or disable transistors 130 (FIG. 10) or AND gates 142 (FIG. 11) in the DPA in response to the associated switches 160.

The row select circuit 154, column select circuit 156 and resampling drivers 161 are clocked by the output of the ADPLL 112. It should be noted that while the switch matrix is shown in a row/column configuration, an actual implementation may not be a precise grid. Hence, a "row" could be any predefined group of switches 160 in the matrix 158.

As described in U.S. Ser. No. 10/006,607, the column select and DEM circuitry 156, the set of switches 160 used to represent a particular row/column configuration varies slightly over time in order to average out non-linearities associated with the output of the DPAs 114 and 116. As the configuration of switches vary, the values of the resampling drivers 161 and, hence, the particular active transistors in the DPAs 114 and 116 vary as well. Thus, for an input binary "00001011", the output of the resampling drivers 161 could vary from "000 . . . 0001111111111" to "000 . . . 0011101111111" to "000 . . . 0111001111111" and so on as the second row of switches 160 is rotated. Other variations are discussed in U.S. Ser. No. 10/006,607.

The fractional controller 152 includes a digital sigma-delta modulator circuit 162 that drives the individual transistors/AND gates in the DPA in response to the fractional bits of the ACW. The digital sigma-delta circuit 162 is clocked by CKVD, which is assumed, in the illustrated embodiment, to be one-half of the 1.8 GHz CKV clock.

To improve the amplitude resolution of a DPA, the digital sigma-delta modulator 162 is used to perform a high-speed dither of the fractional ACW bits. The sigma-delta modulator 162 may be implemented using a first, second, or third order sigma-delta modulator.

The fractional part of the ACW has a longer delay through the ΣΔ modulator 162 than does the integer part of the ACW through the row select circuit 154 and column select circuit 156 and switch matrix 160. The alignment between the integer and fractional parts is achieved by delaying the lower-frequency clock, CKR, used for the final sampling of the integer path, by the appropriate number of the high-speed ΣΔ clock cycles in delay circuit 164.

Further, the propagation time through the AM paths and PM paths will be different. The PM and AM path misalignment is easily corrected by clock-edge delaying the shorter path, which is usually the PM path. Higher frequency clocks can be used for circuitry in the longer path to minimize any misalignment. For example, FREF could be used to clock the circuitry in the PM path and a divided CKV signal could be used to clock the circuitry in the AM path.

Figure 13:
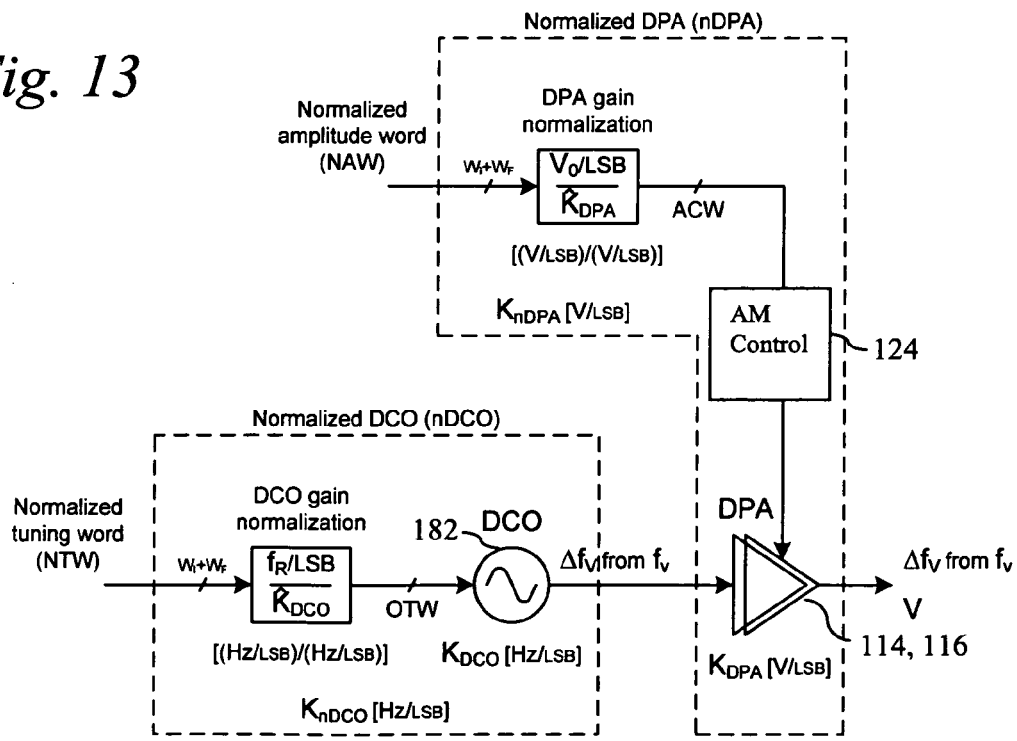
FIG. 13 illustrates an optional improvement that can be made to simplify implementation and improve the accuracy of the AM modulation by normalization.

FIG. 13 illustrates an optional improvement that can be made to ease the implementation and improve the accuracy of the AM modulation. Variations in PVT (process, voltage and temperature) can cause variations in both the amplitude modulation caused by the ACW and the frequency modulation caused by the FCW. To offset the variation, the normalized frequency control word (NTW) is multiplied by $$\frac{f_R/LSB}{\hat{K}_{DCO}},$$

where $f_R/LSB$ is frequency reference FREF, and $\hat{K}_{DCO}$ is the expected actual gain of the DCO, which may vary during operation of the device. Similarly, a normalized amplitude control word (NAW) is multiplied by $$\frac{V_0/LSB}{\hat{K}_{DPA}},$$

where $V_0/LSB$ is the reference maximum amplitude, and $\hat{K}_{DPA}$ is the expected actual gain of the DPA, which may vary during operation of the device. During normal operation, $\hat{K}_{DCO}$ and $\hat{K}_{DPA}$ could be tracked in real-time with an appropriate rate of sampling (depending upon the expected changes in the relevant parameters).

Figure 14:
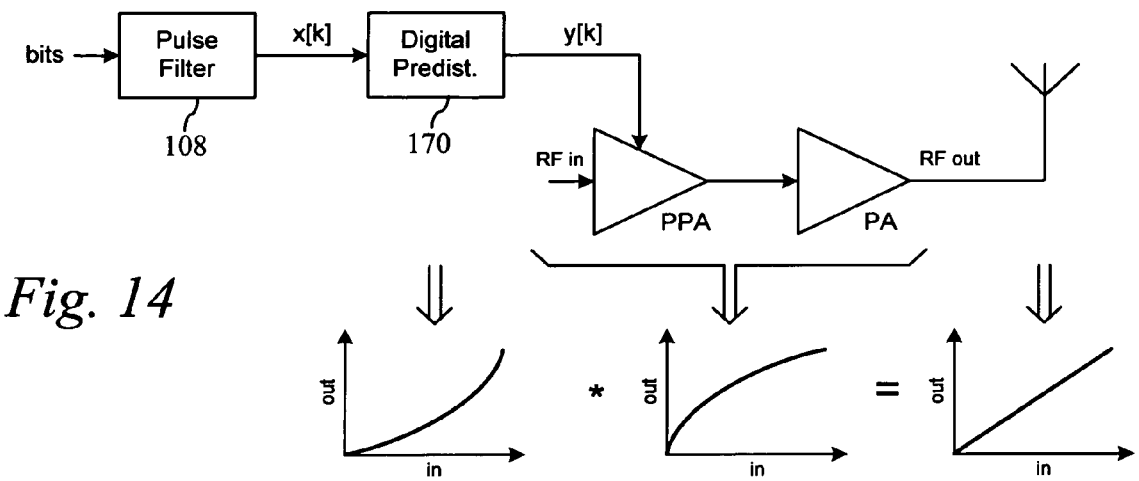
FIG. 14 illustrates a pre-distortion correction for the non-linearities of the digitally controlled power amplifier and the external power amplifier.

FIG. 14 illustrates an optional pre-distortion correction for the non-linearities of the DPA and the power amplifiers. As shown in the diagram, the characteristic of the linearity of the DPA and the power amplifiers is not exactly linear over the useful range. By applying a digital pre-distortion 170 curve to the incoming modulating data (after the pulse filter), where the pre-distortion offsets the non-linearities of the amplifiers, the result of the amplification by the DPA and the power amplifier of the pre-distorted data will effectively be a linear amplification of the data.

Figure 15:
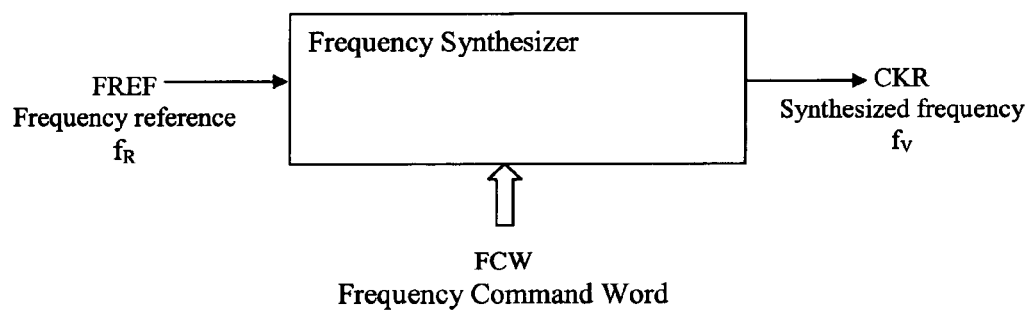
FIGS. 15 and 16 illustrate an all digital phase lock loop circuit used as a frequency synthesizer in FIG. 9.
Figure 16:
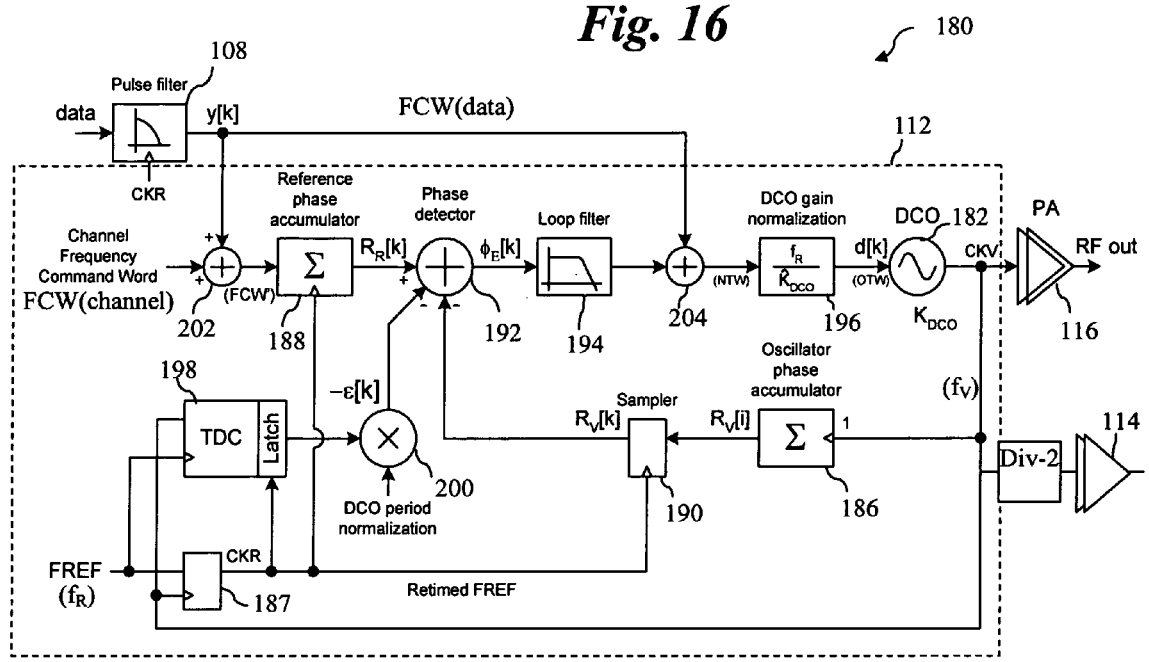

FIGS. 15 and 16 illustrate the ADPLL 112. FIG. 15 illustrates the general operation of the ADPLL 112 acting as a frequency synthesizer. The frequency reference (FREF) clock at frequency $f_R$ contains the only reference timing information for the frequency synthesizer to which the phase and frequency of the RF output are to be synchronized. The RF output CKV at variable frequency ($f_V$) is related to the reference frequency ($f_R$) according to the following formula: $f_V=N \times f_R$, where, N≡FCW is a fractional frequency division ratio.

FIG. 16 illustrates a block diagram of an RF transmitter 180 based on an all-digital phase-locked loop (ADPLL) frequency synthesizer with a digital direct frequency modulation capability. This circuit is described in detail in U.S. Ser. No. 10/131,523, entitled "Digital Phase Locked Loop", to Staszewski et al, filed Dec. 19, 2002, which is incorporated by reference herein. The RF transmitter 180 features digital design and circuit techniques throughout. At the heart of the transmitter 180 lies a digitally-controlled oscillator (DCO) 182, which deliberately avoids any analog tuning voltage controls. This allows for its loop control circuitry to be implemented in a fully digital manner.

The DCO 182 produces a digital variable clock (CKV) in the RF frequency band. In the feedforward path, the CKV clock drives the DPAs 118 and 120. In the feedback path, the CKV clock is used for phase detection and reference retiming.

The channel and data frequency command words are in the frequency command word (FCW) format, defined as the fractional frequency division ratio N with a fine frequency resolution limited only by the FCW wordlength.

In operation, the ADPLL 112 operates in a digitally-synchronous fixed-point phase domain. The variable phase $R_V[i]$ is determined by counting the number of rising clock transitions of the DCO oscillator clock CKV in accumulator 186. The frequency reference signal, FREF, is retimed to CKV in retiming circuit 187 to generate the retimed signal CKR. The reference phase $R_R[k]$ is obtained by accumulating FCW with every cycle CKR clock input in accumulator 188. The sampled variable phase $R_V[k]$ stored at latch 190 is subtracted from the reference phase in a synchronous arithmetic phase detector 192. The digital phase error $\Phi_E[k]$ is filtered by a digital loop filter 194 and then normalized by the DCO gain $K_{DCO}$ in normalization circuit 196 (as shown in FIG. 13) in order to correct the DCO phase/frequency in the negative feedback manner with the loop behavior that is independent from process, voltage and temperature. The FREF retiming quantization error $\epsilon[k]$ is determined by the time-to-digital converter (TDC) 198 and the DCO period normalization multiplier 200. The TDC 198 is built as a simple array of inverter delay elements and flip-flops, which produces time conversion resolution of less than 40 ps in this process.

It should be recognized that the two clock domains, FREF and CKV (high speed variable phase output from the DCO 182), are not entirely synchronous and it is difficult to physically compare the two digital phase values without having to face metastability problems. During the frequency acquisition, their edge relationship is not known and, during the phase lock, the edges will exhibit rotation if the fractional FCW is non-zero. Consequently, the digital-word phase comparison is performed in the same clock domain. The synchronous operation is achieved by over-sampling the FREF clock by the high-rate DCO clock. The resulting retimed CKR clock is thus stripped of the FREF timing information and is used throughout the system. This ensures that the massive digital logic is clocked after the quiet interval of the phase error detection by the TDC.

A chief advantage of keeping the phase information in fixed-point digital numbers is that, after the conversion, it cannot be further corrupted by noise. Consequently, the phase detector 192 can be simply realized as an arithmetic subtractor that performs an exact digital operation. Therefore, the number of conversion places is kept at minimum: a single point where the continuously-valued clock edge delay is compared in a TDC 198.

Accordingly, by specifying a proper FCW, a channel of any desired frequency can be obtained, with high accuracy due to the fractional error correction. Data, processed through pulse filter 200, is modulated on the channel frequency by adding data values y[k] at adders 202 and 204. However, due to the dependency between CKR and FREF, i.e., $f_V$=FCW*$f_R$, the channel frequency will vary along with variations in the frequency of FREF.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the Claims.

The invention claimed is:
1. A transmitter using quadrature modulation, comprising:
a circuitry for converting data symbols into a polar form, having a magnitude signal and an angle signal;
a digital phase modulation circuitry for generating a phase modulated carrier signal responsive to the angle signal;
a digitally controlled amplifier for setting an amplitude for the phase modulated signal; and
a digital amplitude control circuitry for controlling the amplitude of the digitally controlled amplifier responsive to the magnitude signal, wherein the digital amplitude control circuitry converts binary integer value to pseudo-thermometer code, receives a binary fractional value and generates a dithered signal responsive to the binary fractional value.

2. The transmitter of claim 1 wherein the dithered signal is generated using sigma-delta modulation.

3. The transmitter of claim 1 wherein the digital amplitude control circuitry generates an n-bit integer output and an m-bit fractional output, and wherein the digitally controlled amplifier comprises m+n stages, each stage comprising first and second transistors forming a current path, the first transistor driven by a bit of the digital amplitude control and the second transistor driven by the output of the digital phase modulation circuitry.

4. The transmitter of claim 3 wherein the digital amplitude control further includes circuitry for dynamically varying which of the first transistors are enabled for a given magnitude signal.

5. The transmitter of claim 1 wherein the digital amplitude control circuitry generates an n-bit integer output and an m-bit fractional output, and wherein the digitally controlled amplifier comprises in m+n stages, each stage comprising:
    an AND gate having a first input driven by a bit of the digital amplitude control and the second input driven by the output of the digital phase modulation circuitry; and
    a transistor driven by the output of the AND gate.

6. The transmitter of claim 5 wherein the digital amplitude control further includes circuitry for dynamically varying which of the inputs are enabled for a given in a magnitude signal.

7. A transmitter using quadrature modulation, comprising:
    a circuitry for converting data symbols into a polar form, having a magnitude signal and an angle signal;
    a digital phase modulation circuitry for generating a phase modulated carrier signal responsive to the angle signal, the digital phase modulation circuitry comprising a digital phase locked loop circuit for receiving a frequency signal that varies in frequency responsive to the angle signal, the digital phase locked loop circuit including an oscillator and further comprising a normalization circuitry for normalizing the frequency signal to prevent distortions due to process, voltage and temperature variations associated with the oscillator;
    a digitally controlled amplifier for setting an amplitude for the phase modulated signal; and
    a digital amplitude control circuitry for controlling the amplitude of the digitally controlled amplifier responsive to the magnitude signal.

8. A transmitter using quadrature modulation, comprising:
    a circuitry for converting data symbols into a polar form, having a magnitude signal and an angle signal;
    a digital phase modulation circuitry for generating a phase modulated carrier signal responsive to the angle signal;
    a digitally controlled amplifier for setting an amplitude for the phase modulated signal;
    a digital amplitude control circuitry for controlling the amplitude of the digitally controlled amplifier responsive to the magnitude signal; and
    a normalization circuitry for normalizing the amplitude signal to prevent distortions due to process/voltage/temperature variations associated with the digitally controlled amplifier.

9. A circuit for amplitude modulation of a signal, comprising:
    a circuitry for providing a digital amplitude modulation signal having a integer set of bits and a fractional set of bits, where a portion of fractional set of bits is dithered;
    a digital amplifier comprising a plurality of switching elements for setting the output amplitude where the switching elements are driven by respective bits of the digital amplitude modulation signal.

10. The circuit of claim 9 wherein the circuitry for providing the digital amplitude modulation signal dithers the fractional portion using sigma-delta modulation.

11. The circuit of claim 9 wherein the switching elements are transistors.

12. The circuit of claim 9 and further comprising a matching network coupled to the digital amplifier.

13. The circuit of claim 9 wherein some or all of the bits are generated using a dynamic element matching circuit.

14. The circuit 9 and further comprising delay circuitry for time alignment of the integer set and the fractional set.

15. A method of performing quadrature modulation of a signal, comprising the steps of:
    converting data symbols into a polar form, having a magnitude signal and an angle signal;
    generating a phase modulated carrier signal responsive to the angle signal;
    receiving the phase modulated carrier signal in a digitally controlled amplifier; and
    controlling the amplitude of the digitally controlled amplifier responsive to the magnitude signal, said controlling comprises the step of converting binary integer values to pseudo-thermometer code, receiving a binary fractional value and generating a dithered signal responsive to the binary fractional value.

16. The method of claim 15 wherein the step of generating the dithered signal comprises the step of generating a sigma-delta modulated signal.

17. The method of claim 15 wherein the controlling step further comprises the step of generating an n-bit integer output and an m-bit fractional output, and driving respective m+n transistors in the digitally controlled amplifier responsive thereto.

18. The method of claim 17 wherein the controlling, step further includes circuitry dynamically varying which of the transistors are enabled for a given magnitude signal.

19. A method of performing quadrature modulation of a signal, comprising the steps of:
    converting data symbols into a polar form, having a magnitude signal and an angle signal, comprising receiving a frequency signal that varies in frequency responsive to the angle signal using a digital phase locked loop circuit;
    generating a phase modulated carrier signal responsive to the angle signal;
    receiving the phase modulated carrier signal in a digitally controlled amplifier;
    controlling the amplitude of the digitally controlled amplifier responsive to the magnitude signal; and
    normalizing the frequency signal to prevent distortions due to process, voltage and temperature variations associated with an oscillator in the digital phase locked loop circuit.

20. A method of performing quadrature modulation of a signal, comprising the steps of:
    converting data symbols into a polar form, having a magnitude signal and an angle signal;
    generating a phase modulated carrier signal responsive to the angle signal;
    receiving the phase modulated carrier signal in a digitally controlled amplifier;
    controlling the amplitude of the digitally controlled amplifier responsive to the magnitude signal; and normalizing the amplitude signal to prevent distortions due to process, voltage and temperature variations associated with the digitally controlled amplifier.

21. A method of controlling a digitally controlled power amplifier comprising:
   driving a first set of switching elements responsive to respective bits of an integer amplitude value;
   driving a second set of switching elements responsive to respective bits of a dithered signal representing a fractional amplitude value.

22. The method of claim 21 and further comprising the step of passing the output of the digitally controlled amplifier to a matching network.

23. The method of claim 21 wherein some or all of the bits are generated using a dynamic element matching circuit.

24. The method of claim 21 and further comprising the step of delaying the integer set for time alignment with the fractional set.

25. The method of claim 21 wherein the step of driving a second set of switching elements comprises the step of driving the second set of switching elements responsive to respective bits of a sigma-delta modulated signal representing a fractional amplitude value.

* * * * *